United States Patent
Colbert et al.

(10) Patent No.: US 9,445,507 B2
(45) Date of Patent: *Sep. 13, 2016

(54) PACKAGING FOR EIGHT-SOCKET ONE-HOP SMP TOPOLOGY

(71) Applicant: International Business Machines Corporation, Armonk, NY (US)

(72) Inventors: John L. Colbert, Byron, MN (US); Daniel M. Dreps, Georgetown, TX (US); Paul M. Harvey, Austin, TX (US); Rohan U. Mandrekar, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/731,815

(22) Filed: Jun. 5, 2015

(65) Prior Publication Data
US 2015/0271926 A1 Sep. 24, 2015

Related U.S. Application Data

(63) Continuation of application No. 14/136,135, filed on Dec. 20, 2013.

(51) Int. Cl.
| *H05K 3/32* | (2006.01) |
|---|---|
| *G06F 1/18* | (2006.01) |
| *H05K 7/10* | (2006.01) |
| *G06F 1/20* | (2006.01) |
| *H01L 25/10* | (2006.01) |

(Continued)

(52) U.S. Cl.
CPC ............... *H05K 3/325* (2013.01); *G06F 1/183* (2013.01); *G06F 1/20* (2013.01); *H05K 7/1061* (2013.01); *H01L 23/36* (2013.01); *H01L 23/49827* (2013.01); *H01L 25/105* (2013.01); *H01L 2225/107* (2013.01); *H01L 2924/15313* (2013.01); *Y10T 29/49128* (2015.01); *Y10T 29/49169* (2015.01)

(58) Field of Classification Search
CPC .......................... H05K 3/325; H05K 7/1061
USPC ........................................................ 439/65
See application file for complete search history.

(56) References Cited

U.S. PATENT DOCUMENTS

| 6,373,715 | B1 | 4/2002 | Zeng et al. |
|---|---|---|---|
| 6,477,058 | B1 | 11/2002 | Luebs et al. |
| 7,438,557 | B1 | 10/2008 | Plucinski et al. |
| 7,690,927 | B1 | 4/2010 | Kerrigan et al. |

(Continued)

OTHER PUBLICATIONS

U.S. Appl. No. 14/136,135.

*Primary Examiner* — David Warren
(74) *Attorney, Agent, or Firm* — Stephen R. Tkacs; Stephen J. Walder, Jr.; Joseph Petrokaitis

(57) ABSTRACT

A mechanism is provided for packaging a multiple socket, one-hop symmetric multiprocessor topology. The mechanism connects each of a first plurality of processor modules to a first multiple-socket planar via a respective one of a first plurality of land grid array (LGA) connectors. The mechanism connects the first multiple-socket planar to a first side of a redistribution card via a second plurality of LGA connectors. The mechanism connects each of a second plurality of processor modules to a second multiple-socket planar via a respective one of a third plurality of LGA connectors. The mechanism connects the second multiple-socket planar to a second side of the redistribution card via a fourth plurality of LGA connectors.

7 Claims, 8 Drawing Sheets

(51) Int. Cl.
*H01L 23/36* (2006.01)
*H01L 23/498* (2006.01)

(56) References Cited

U.S. PATENT DOCUMENTS

| | | | |
|---|---|---|---|
| 7,785,114 B2 | 8/2010 | Brist et al. | |
| 7,791,889 B2 | 9/2010 | Belady et al. | |
| 2003/0000080 A1* | 1/2003 | Colbert | H05K 7/1061 29/832 |
| 2003/0058624 A1* | 3/2003 | Deeney | H05K 7/1061 361/736 |
| 2007/0224845 A1* | 9/2007 | Becker | H01L 23/3675 439/66 |
| 2008/0150122 A1 | 6/2008 | Lee et al. | |
| 2011/0085313 A1* | 4/2011 | Colbert | H05K 1/144 361/803 |
| 2011/0287638 A1* | 11/2011 | Beaman | H01L 23/4006 439/65 |
| 2012/0147563 A1* | 6/2012 | Colbert | G06F 1/20 361/715 |
| 2014/0127915 A1* | 5/2014 | Banitt | H01R 43/205 439/66 |
| 2014/0153173 A1* | 6/2014 | Pombo | G02B 27/0149 361/679.03 |
| 2015/0177794 A1* | 6/2015 | Colbert | G06F 1/183 361/679.02 |
| 2016/0011291 A1* | 1/2016 | Condorelli | G01R 35/005 324/601 |

\* cited by examiner

PACKAGING FOR EIGHT-SOCKET ONE-HOP SMP TOPOLOGY

BACKGROUND

The present application relates generally to an improved data processing apparatus and method and more specifically to mechanisms for providing a packaging for an eight-socket one-hop symmetric multiprocessing topology.

Symmetric multiprocessing (SMP) involves a multiprocessor computer hardware and software architecture where two or more identical processors are connected to a single shared main memory. The processors have full access to all I/O devices. All processors are treated equally, with none being reserved for special purposes. Most common multiprocessor systems today use SMP architecture. In the case of multi-core processors, the SMP architecture may apply to the cores, treating them as separate processors.

SMP systems are tightly coupled multiprocessor systems with a pool of processors running independently. The processors execute different programs and work on different data. The processors have a capability of sharing common resources (memory, I/O device, interrupt system, etc.). Processors may be interconnected using buses, crossbar switches, or on-chip mesh networks. The bottleneck in the scalability of SMP using buses or crossbar switches is the bandwidth and power consumption of the interconnect between the various processors, the memory, and the disk arrays.

SUMMARY

In one illustrative embodiment, a method, in a data processing system, is provided for packaging a multiple socket, one-hop symmetric multiprocessor topology. The method comprises connecting each of a first plurality of processor modules to a first multiple-socket planar via a respective one of a first plurality of land grid array (LGA) connectors. The method further comprises connecting the first multiple-socket planar to a first side of a redistribution card via a second plurality of LGA connectors. The method further comprises connecting each of a second plurality of processor modules to a second multiple-socket planar via a respective one of a third plurality of LGA connectors. The method further comprises connecting the second multiple-socket planar to a second side of the redistribution card via a fourth plurality of LGA connectors.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
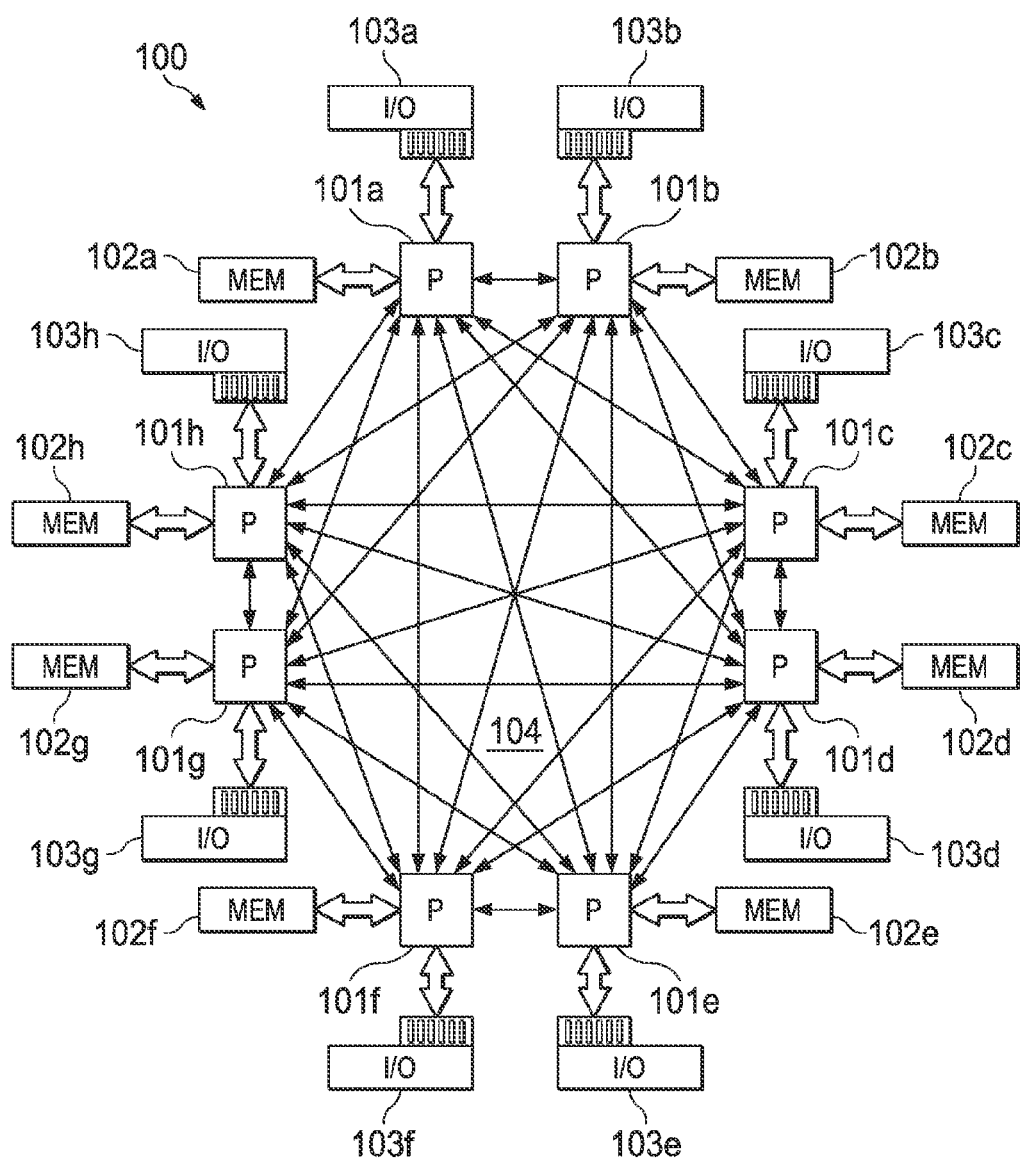
FIG. 1 depicts a pictorial representation of an example symmetric multiprocessing system in which aspects of the illustrative embodiments may be implemented.

The illustrative embodiments provide packaging for eight-socket, one-hop symmetric multiprocessing topology. A symmetric multiprocessing (SMP) system exhibits scaling characteristics that are beneficially impacted by increasing the SMP interconnect bisection bandwidth and by decreasing the worst-case latency through the SMP interconnect. For instance, an SMP system exhibits attributes that enable the system throughput of a system comprising N processors to most closely approach N times the throughput of a single processor. Worst-case latency can be significantly reduced by limiting the number of hierarchical layers or hops in the connections between processor chips in the SMP system.

Today's most advanced commercial SMP architectures connect up to four processor ships in a single one-hop node. This is accomplished by connecting all four processor chips with dedicated point-to-point busses, which requires a total of six busses. Scaling this high performance node to eight processor chips in a one-hop node would require twenty-eight busses. There is no existing packaging technology that will enable an eight-processor, one-hop node except with very narrow (e.g., <10 GB/s) bandwidth busses. Because interconnect bandwidth severely limits scaling performance, narrow busses that are compatible with existing packaging technology constraints are generally not considered acceptable for intra-node connections and, thus, nodes with eight processor chips are not realized in commercially viable SMP systems.

The illustrative embodiments describe a novel packaging interconnect technology that can be used to interconnect eight or more processor chips in a one-hop node with significant compute performance advantages. Additional performance advantages of the eight-processor node system are also realized because each processor chip in the node can connect to additional nodes via second tier connections. While in the prior art, a four-chip node can connect up to eight other nodes affording a total of thirty-two processor chips connected in a two-tier system architecture, the illustrative embodiments enable an eight-chip node to be interconnected to eight other nodes resulting in 128 processor chips in a two-tier system architecture, thus quadrupling the size of the interconnected system.

A "mechanism," as used herein, may be an implementation of the functions or aspects of the illustrative embodiments in the form of an apparatus, a procedure, or a computer program product. The mechanisms described herein may be implemented as specialized hardware, software executing on general purpose hardware, software instructions stored on a medium such that the instructions are readily executable by specialized or general purpose hardware, a procedure or method for executing the functions, or a combination of the above.

The aspects and advantages of the illustrative embodiments of the present invention will be described in greater detail hereafter with reference to the accompanying figures. It should be appreciated that the figures are only intended to be illustrative of exemplary embodiments of the present invention. The present invention may encompass aspects, embodiments, and modifications to the depicted exemplary embodiments not explicitly shown in the figures but would be readily apparent to those of ordinary skill in the art in view of the present description of the illustrative embodiments.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium is a system, apparatus, or device of an electronic, magnetic, optical, electromagnetic, or semiconductor nature, any suitable combination of the foregoing, or equivalents thereof. More specific examples (a non-exhaustive list) of the computer readable storage medium would include the following: an electrical device having a storage capability, a portable computer diskette, a hard disk, a random access memory (RAM), a read-only memory (ROM), an erasable programmable read-only memory (EPROM or Flash memory), an optical fiber based device, a portable compact disc read-only memory (CDROM), an optical storage device, a magnetic storage device, or any suitable combination of the foregoing. In the context of this document, a computer readable storage medium is any tangible medium that can contain or store a program for use by, or in connection with, an instruction execution system, apparatus, or device.

In some illustrative embodiments, the computer readable medium is a non-transitory computer readable medium. A non-transitory computer readable medium is any medium that is not a disembodied signal or propagation wave, i.e. pure signal or propagation wave per se. A non-transitory computer readable medium may utilize signals and propagation waves, but is not the signal or propagation wave itself. Thus, for example, various forms of memory devices, and other types of systems, devices, or apparatus, that utilize signals in any way, such as, for example, to maintain their state, may be considered to be non-transitory computer readable media within the scope of the present description.

A computer readable signal medium, on the other hand, may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Similarly, a computer readable storage medium is any computer readable medium that is not a computer readable signal medium.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 1 is a block diagram illustrating an example symmetric multiprocessing system for which aspects of the illustrative embodiments may be applied. The symmetric multiprocessing (SMP) system 100 comprises a plurality of processors 101a-101h connected via a plurality of busses 104. Each processor 101a-101h may have a plurality of processor cores. For best performance and scaling, busses 104 may be wide bandwidth, point-to-point busses.

Each processor 101a-101h is connected to a respective memory 102a-102h. The memories 102a-102h may be dual inline memory modules (DIMMs), for example.

Each processor 101a-101h is also connected to a respective I/O interface 103a-103h. The I/O interfaces 103a-103h may be, for example, peripheral component interface (PCI) adapters, such as PCI express (PCIe) adapters. In the depicted example, SMP system 100 is a single node that connects to other nodes using I/O) adapters 103a-103h. That is, processors 101a-101h communicate with each other via busses 104 in one hop and connect to processors of other nodes in a second tier via I/O adapters 103a-103h.

In accordance with an illustrative embodiment, packaging interconnect technology is provided that can be used to interconnect eight or more processor chips, such as processors 101a-101h, in a one-hop node. The packaging interconnect technology may also include the memories 102a-102h and the I/O adapters 103a-103h on the same SMP node package.

As described above, currently available SMP systems can connect up to four individually packaged processor chips on a planar or up to four processor chips on a multi-chip module (MCM). Placing more than four processor chips on a single planar becomes impractical because of the single layers required in the board that are necessary to interconnect all four of the processor chips with sufficient bandwidth. Furthermore, each processor chip in a commercial, general purpose SMP system requires sufficient memory cards proximate to the respective processor. This limits space available on the planar for more than four processor chips.

Multi-chip modules have been limited to four processor chips because of the large number of interconnects off the MCM required to reach memory and the difficulty in placing enough memory proximate to the MCM to service more than four processor chips. Thus, it is not possible to realize the high bandwidth, eight-node, one-hop system with the packaging technology described in the prior art.

A typical node (planar) consists of processors (sockets), their associated memory (DIMMs), and power distribution (regulators) along with other system components. Given the general size of system racks, processor modules, DIMMs, regulators etc., it is difficult to fit more than four sockets along with their associated DIMMs and regulators) on a single planar. That means to make an eight-socket node, two planars must be interconnected. Connecting these eight processor chips using two planars requires sixteen interconnect links between the two planars. Existing off-planar interconnect schemes, such as copper cables or flex cables do not provide the required pin density to accommodate the sixteen inter-planar links at the required bus width. Lowering the bus width means reducing the SMP bandwidth, thus lowering system performance.

Figure 2A:
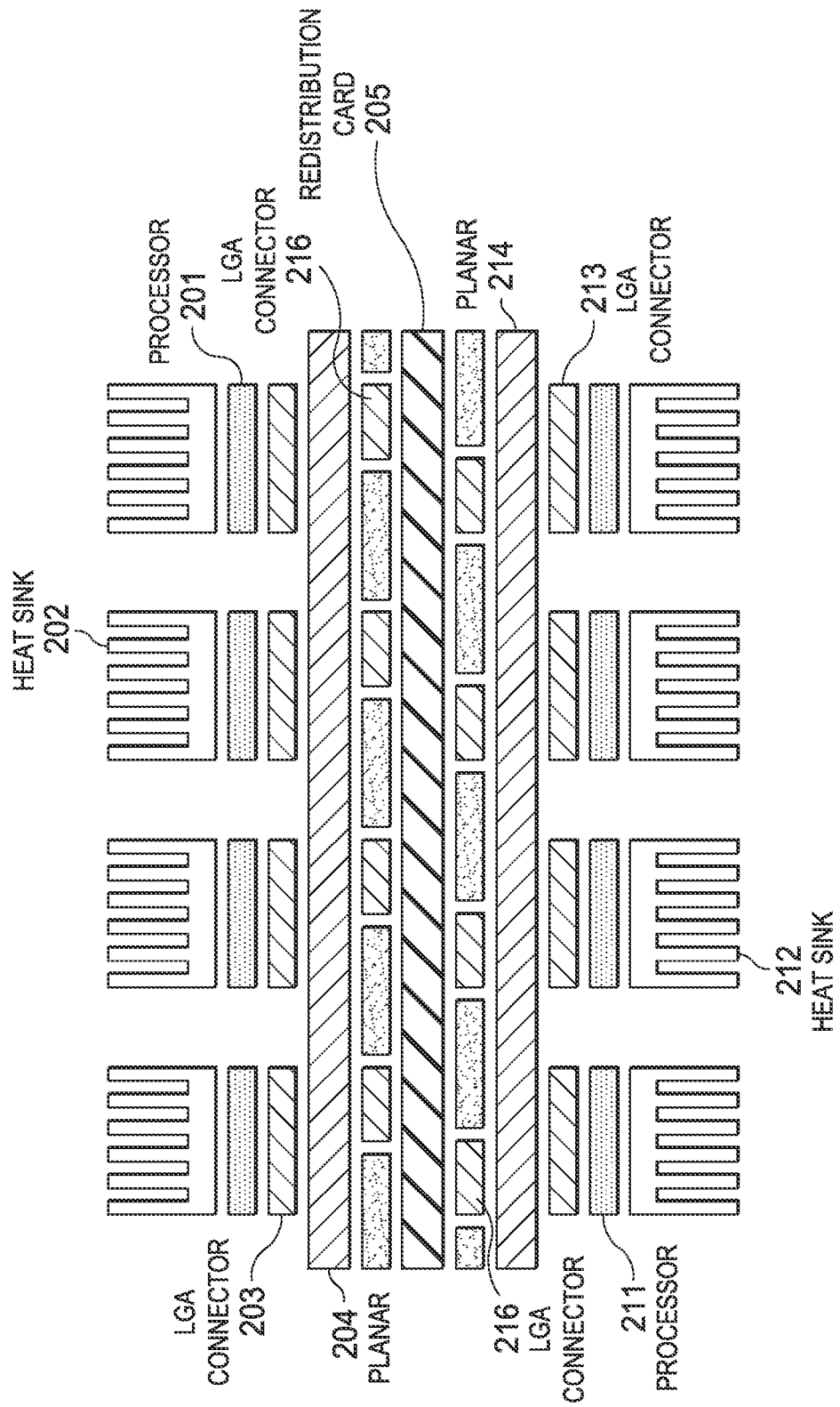
FIGS. 2A and 2B illustrate a packaging technology that interconnects two four-socket planars vertically through a stacked land grid array and a redistribution card in accordance with an illustrative embodiment.
Figure 2B:
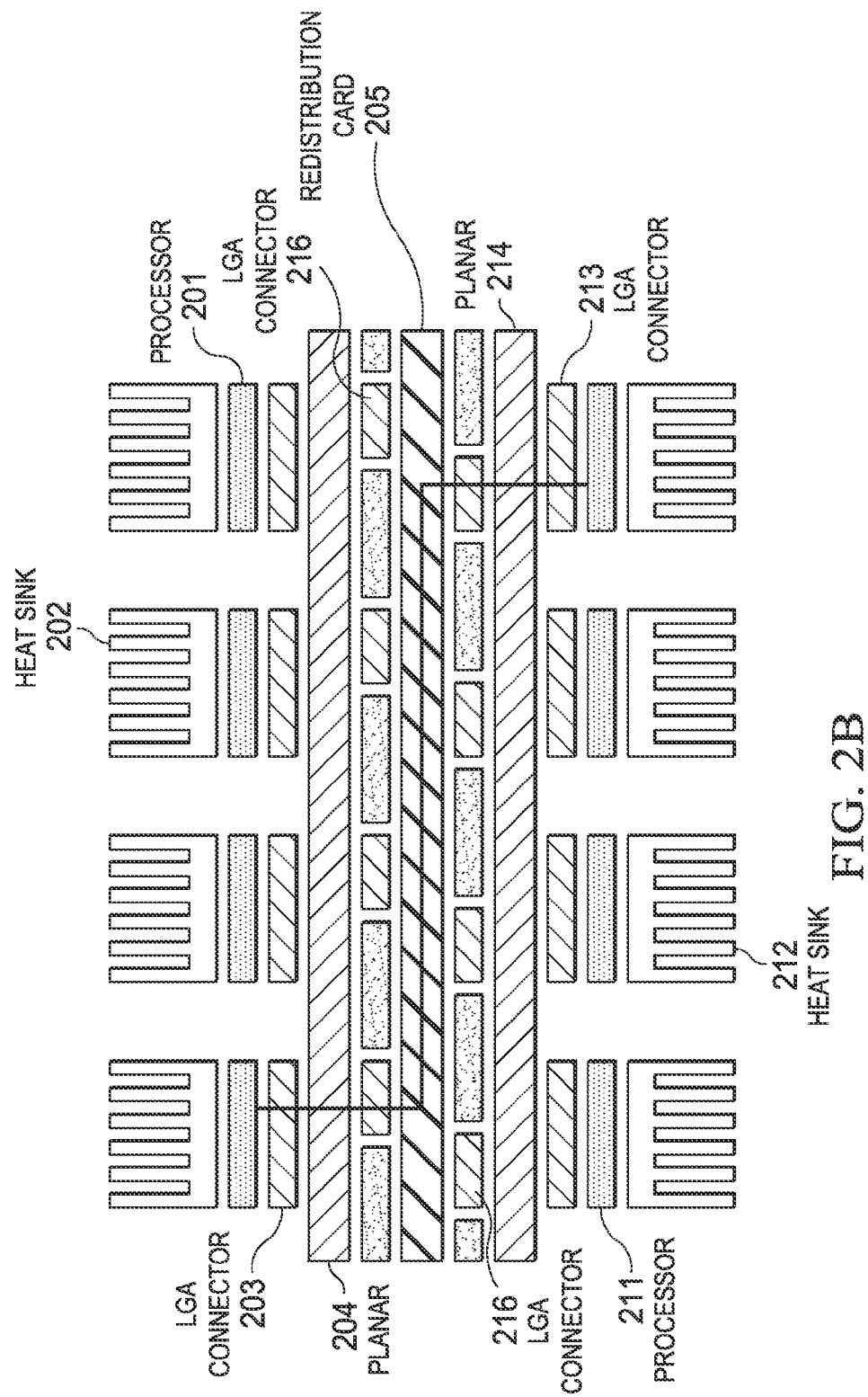

FIGS. 2A and 2B illustrate a packaging technology that interconnects two four-socket planars vertically through a stacked land grid array and a redistribution card in accordance with an illustrative embodiment. With reference to FIG. 2A, a first set of four processor chips 201 are connected to a first planar 204 using land grid array (LGA) connectors 203. Each chip in the first set of processor chips 201 has a corresponding heat sink 202. The land grid array (LGA) is a type of surface-mount packaging for integrated circuits (ICs) that is notable for having the pins on the socket rather than the integrated circuit. Each LGA connector 203 can be electrically connected to a printed circuit board (PCB) or planar 204 either by the use of a socket or by soldering directly to the board. Planar 204 provides six interconnect links between the first set of processors 201.

A second set of four processor chips 211 are connected to a second planar 214 using land grid array (LGA) connectors 213. Each chip in the first set of processor chips 211 has a corresponding heat sink 212. Planar 214 provides six interconnect links between the second set of processors 211. Note that second planar 214 has been flipped upside down relative to first planar 204.

The first planar 204 is interconnected with redistribution card 205 on a first side via LGA connectors 206. The second planar 214 is interconnected with redistribution card 205 on a second side via LGA connectors 216. Redistribution card 205 provides sixteen interconnect links between planars 204, 214. Also, planar 204 provides interconnect links from processors 201 to redistribution card 205, and planar 214 provides interconnect links from processors 211 to redistribution card 205. The redistribution card may use build-up laminate technology, high density interconnect (HDI) technology, or printed circuit board (PCB) technology, for example.

As shown in FIG. 2A, LGA connectors 206 and LGA connectors 216 are offset such that bus routing down to the redistribution card is restricted to only half of the socket footprint. This results in the structure requiring only a two stack of LGA connectors held by a stiffener. This is mechanically desirable. Not having this requirement would result in a four-stack of LGA connectors, which is much more mechanically complex. However, the four-stack approach enables more wires to be escaped and routed through the redistribution card.

The vertical stack approach of the illustrative embodiment allows a significantly larger bus width (at least twice the bus width) on the sixteen inter-planar links. Therefore, the packaging technology shown in FIG. 2A provides much better bandwidth, reduces latency on the inter-planar links, and improves signal integrity characteristics as compared to the cables/flex approach.

FIG. 2B illustrates an inter-planar bus from processor 201 in the first set of processors to processor 211 in the second set of processors. The inter-planar bus connects processor 201 to the redistribution card 205 through LGA connector 203, first planar 204, and LGA connector 206. Redistribution card 205 provides an inter-planar link from planar 204 to planar 214. The inter-planar bus connects redistribution card 205 to processor 211 through LGA connector 216, second planar 214, and LGA connector 213.

Figure 3A:
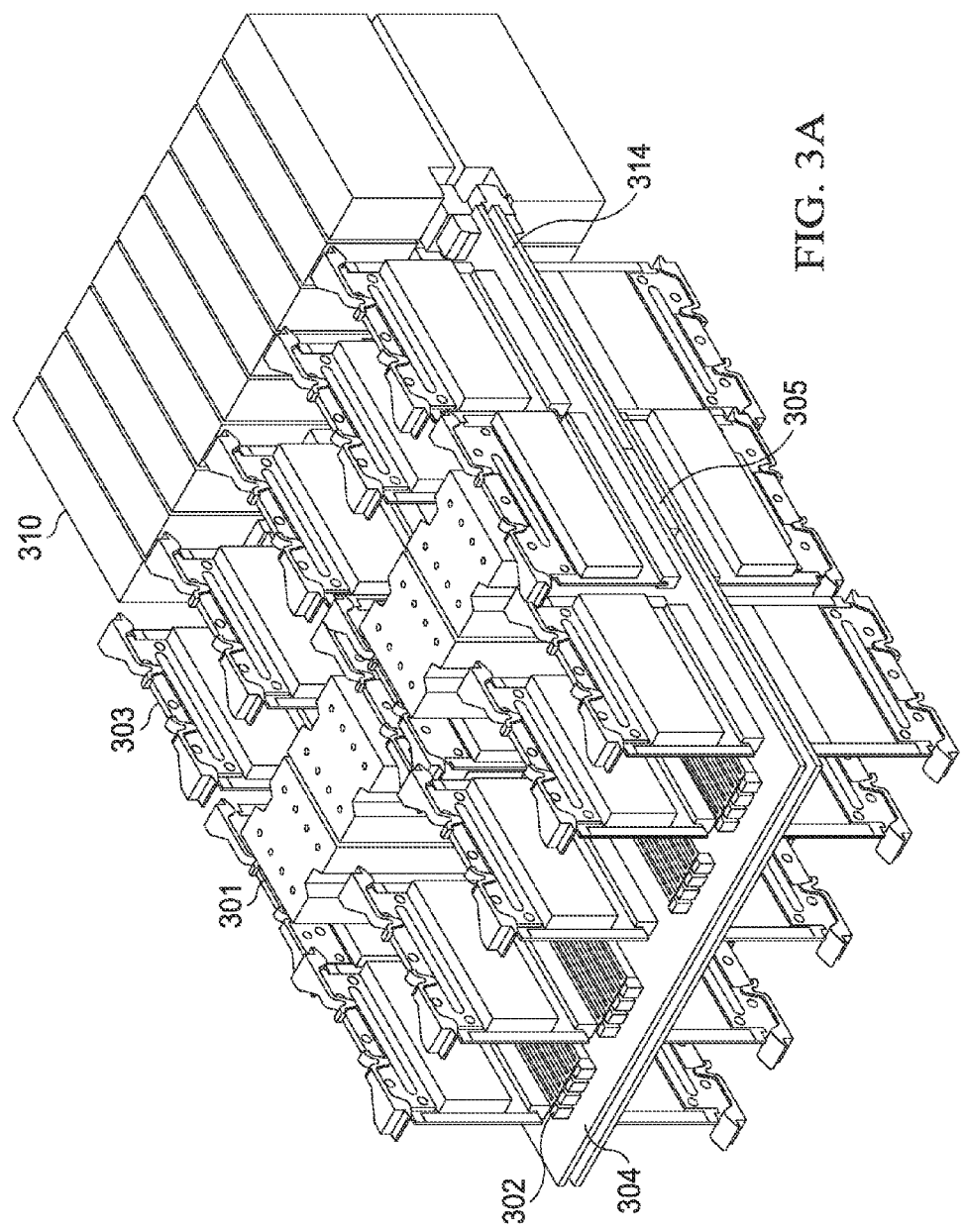
FIGS. 3A-3C show various views of an eight-socket, one-hop package in accordance with an illustrative embodiment.
Figure 3B:
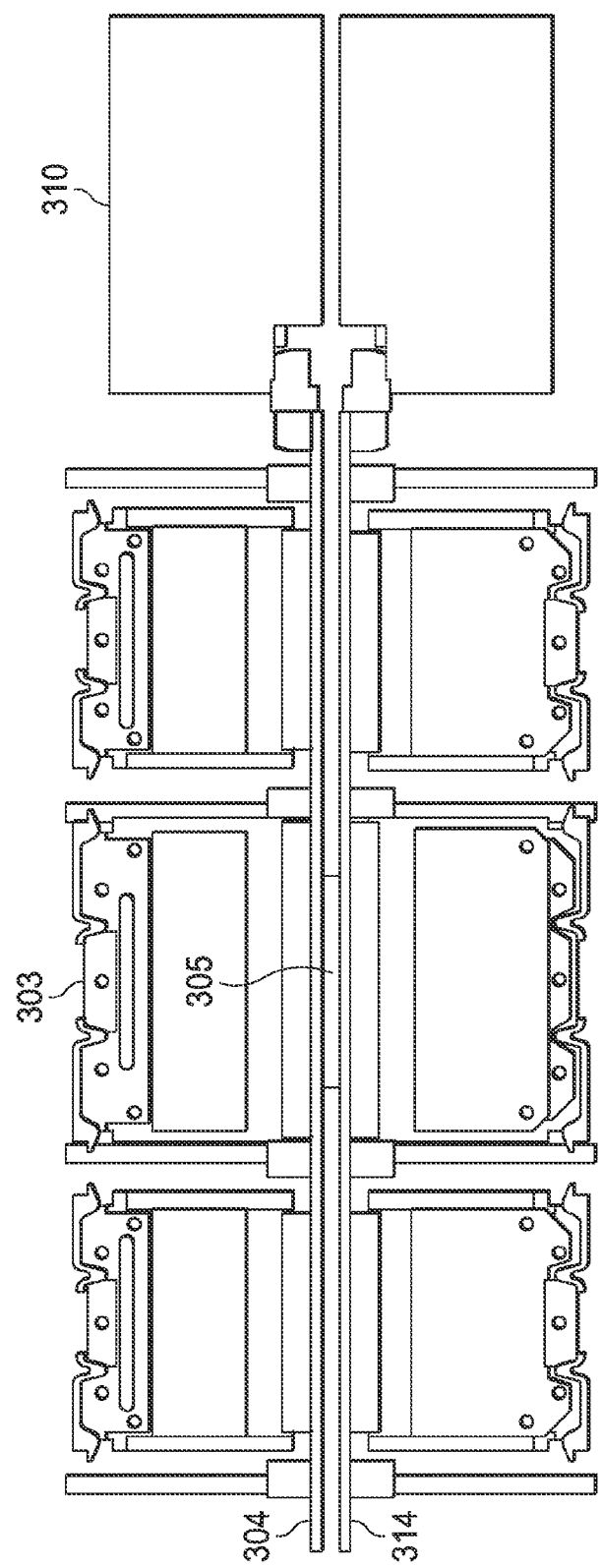
Figure 3C:
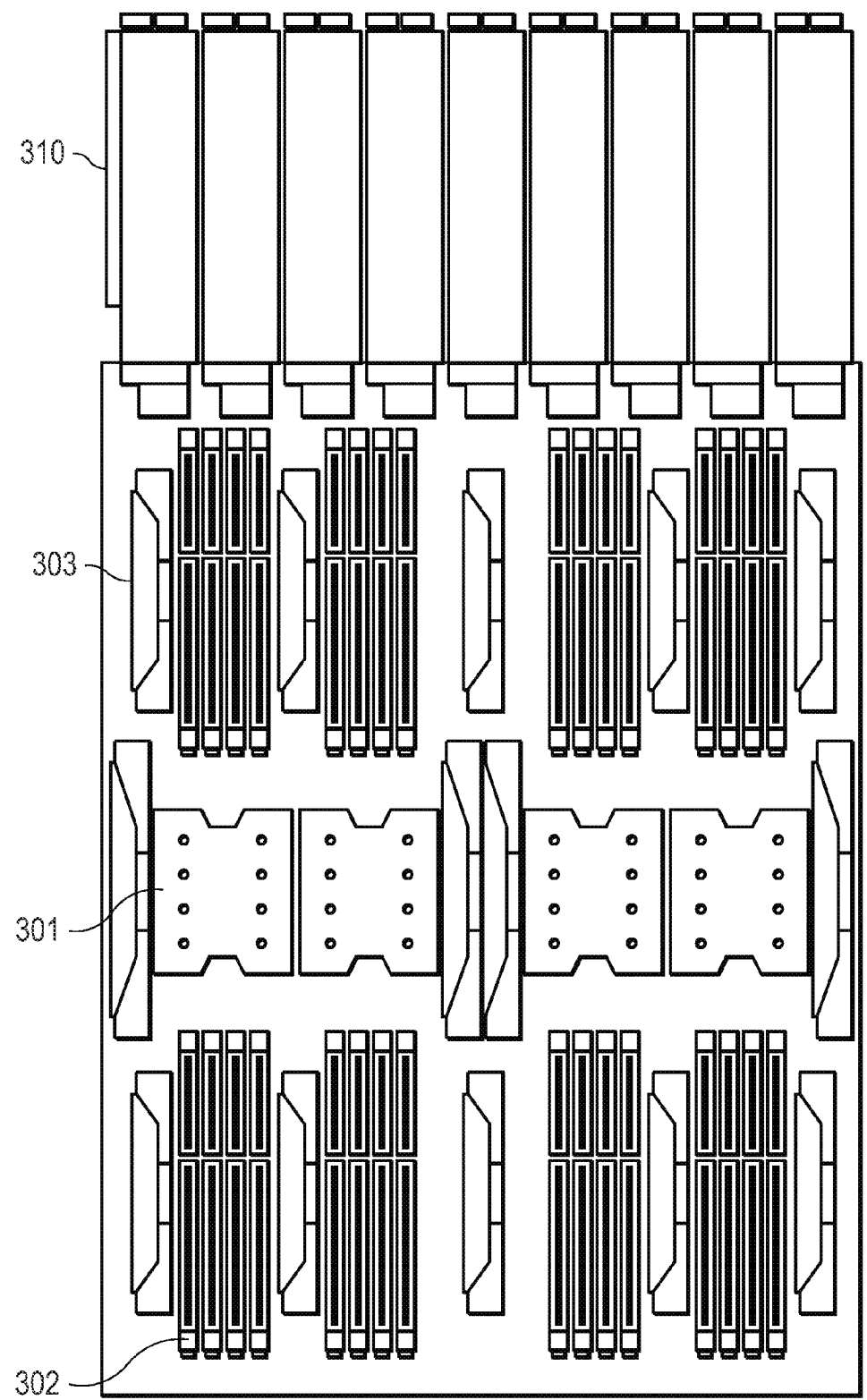

FIGS. 3A-3C show various views of an eight-socket, one-hop package in accordance with an illustrative embodiment. FIG. 3A shows an isometric view of the package in a first view. The package comprises two planars 304, 314. The first planar 304 has four processor sockets 301 and four sets of memory slots 302. Each processor socket 301 may have a processor chip connected with a heat sink. Memory slots 302 may be configured to accept memory modules, such as dual inline memory modules (DIMMs), for example. The second planar 314 is similar to the first planar 304 but flipped upside down. The first planar 304 and the second planar 314 are connected via redistribution card 305.

Each planar also has voltage regulator modules (VRMs) 303. The package also includes one or more I/O adapters 310. The I/O adapters 310 may be peripheral component interface (PCI) adapters, for example, and may be connected via a PCI connector slot.

FIG. 3B shows a side view of the package in a second view. As seen in this view, the first planar 304 and the second planar 314 are connected via redistribution card 305.

FIG. 3C shows a top-down view of the package in a third view. As seen in this view, each planar has adequate space for four processor sockets 301 and their associated memory slots 302 and voltage regulators 303.

Figure 4:
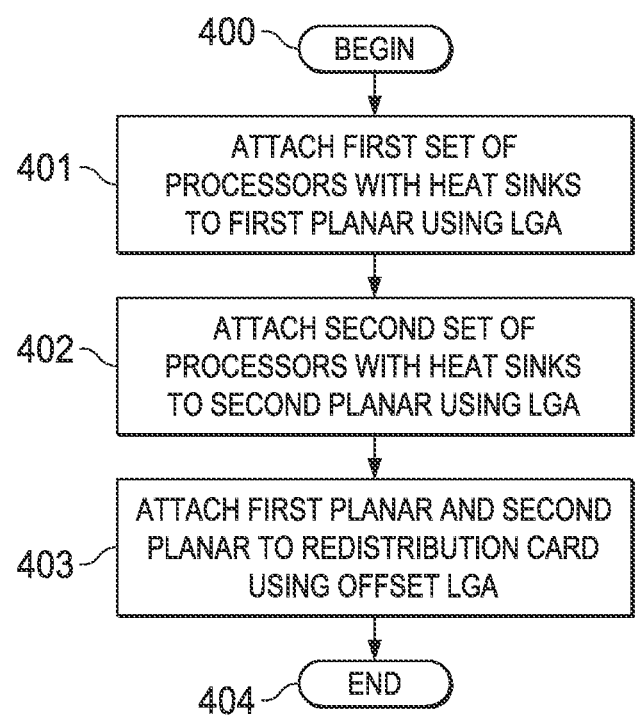
FIG. 4 is a flowchart illustrating operation of a mechanism for providing a packaging technology that interconnects two four-socket planars vertically through a stacked land grid array and a redistribution card in accordance with an illustrative embodiment.

FIG. 4 is a flowchart illustrating operation of a mechanism for providing a packaging technology that interconnects two four-socket planars vertically through a stacked land grid array and a redistribution card in accordance with an illustrative embodiment. Operation begins (block 400), and the mechanism attaches a first set of processors with heat sinks to a first planar using land grid array (LGA) connectors (block 401). The mechanism then attaches a second set of processors with heat sinks to a second planar, which is similar to the first planar but flipped upside down, using LGA connectors (block 402). The mechanism attaches the first planar and the second planar to a redistribution card using offset LGA connectors (block 403). Thereafter, operation ends (block 404).

Figure 5:
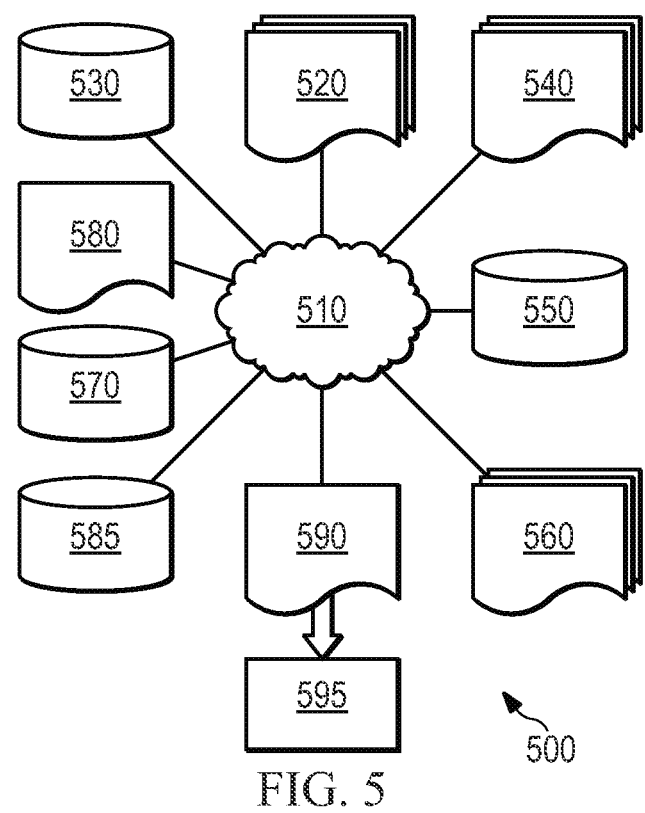
FIG. 5 is a flow diagram of a design process used in device design, manufacture, and/or test.

FIG. 5 shows a block diagram of an exemplary design flow 500 used for example, in device design, manufacturing, and/or test. Design flow 500 may vary depending on the type of device being designed. For example, a design flow 500 for building a chip package topology or system planar may differ from a design flow 500 for designing an application specific IC (ASIC). Design structure 520 is preferably an input to a design process 510 and may come from an IP provider, a core developer, or other design company or may be generated by the operator of the design flow, or from other sources. Design structure 520 comprises an embodiment of the invention as shown in FIGS. 2A, 2B, and 3A-3C in the form of schematics or HDL, a hardware-description language (e.g., Verilog, VHDL, C, etc.). Design structure 520 may be contained on one or more machine readable media. For example, design structure 520 may be a text file or a graphical representation of an embodiment of the invention as shown in FIGS. 2A, 2B, and 3A-3C. Design process 510 preferably synthesizes (or translates) an embodiment of the invention as shown in FIGS. 2A, 2B, and 3A-3C into a netlist 580, where netlist 580 is, for example, a list of wires, transistors, logic gates, control circuits, I/O, models, etc., that describes the connections to other elements and circuits in an integrated circuit design and recorded on at least one machine readable medium. This may be an iterative process in which netlist 580 is resynthesized one or more times depending on design specifications and parameters for the circuit.

Design process 510 may include using a variety of inputs; for example, inputs from library elements 530 which may house a set of commonly used elements, circuits, and devices, including models, layouts, and symbolic representations, for a given manufacturing technology (e.g., different technology nodes, 32 nm, 45 nm, 90 nm, etc.), design specifications 540, characterization data 550, verification data 560, design rules 570, and test data files 585 (which may include test patterns and other testing information). Design process 510 may further include, for example, standard circuit design processes such as timing analysis, verification, design rule checking, place and route operations, etc. One of ordinary skill in the art of integrated circuit design can appreciate the extent of possible electronic design automation tools and applications used in design process 510 without deviating from the scope and spirit of the invention. The design structure of the invention is not limited to any specific design flow.

Design process 510 preferably translates an embodiment of the invention as shown in FIGS. 2A, 2B, and 3A-3C, along with any additional integrated circuit design or data (if applicable), into a second design structure 590. Design structure 590 resides on a storage medium in a data format used for the exchange of layout data of integrated circuits (e.g. information stored in a GDSII (GDS2), GL1, OASIS, or any other suitable format for storing such design structures). Design structure 590 may comprise information such as, for example, test data files, design content files, manufacturing data, layout parameters, wires, levels of metal, vias, shapes, data for routing through the manufacturing line, and any other data required by a device manufacturer to produce an embodiment of the invention as shown in FIGS. 2A, 2B, and 3A-3C. Design structure 590 may then proceed to a stage 595 where, for example, design structure 590: proceeds to tape-out, is released to manufacturing, is released to a mask house, is sent to another design house, is sent back to the customer, etc.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for packaging a multiple socket, one-hop symmetric multiprocessor topology, the method comprising:
    connecting each of a first plurality of processor modules to a first multiple-socket planar via a respective one of a first plurality of land grid array (LGA) connectors;
    connecting the first multiple-socket planar to a first side of a redistribution card via a second plurality of LGA connectors;
    connecting each of a second plurality of processor modules to a second multiple-socket planar via a respective one of a third plurality of LGA connectors; and
    connecting the second multiple-socket planar to a second side of the redistribution card via a fourth plurality of LGA connectors.

2. The method of claim 1, further comprising;
    establishing an inter-planar link from a first socket of the first multiple-socket planar to a second socket of the second multiple-socket planar through the redistribution card.

3. The method of claim 1, further comprising:
    establishing an interconnect link from a first socket of the first multiple-socket planar to a second socket of the first multiple-socket planar.

4. The method of claim 1, further comprising:
    establishing an interconnect link from a first socket of the second multiple-socket planar to a second socket of the second multiple-socket planar.

5. The method of claim 1, wherein e redistribution card uses build-up laminate technology, high density interconnect (HDI) technology, or printed circuit board (PCB) technology.

6. The method of claim 1, wherein the second plurality of LGA connectors and the fourth plurality of LGA connectors use opposite sides of the socket footprint and do not overlap in the stack.

7. The method of claim 1, further comprising:
    connecting a first plurality of memory modules and a first plurality of voltage regulators to the first multiple-socket planar; and
    connecting a second plurality of memory modules and a second plurality of voltage regulators to the second multiple-socket planar.

* * * * *